(12) United States Patent
Gaddipati et al.

(10) Patent No.: US 7,382,127 B2
(45) Date of Patent: Jun. 3, 2008

(54) SYSTEM AND METHOD OF ACCELERATED MR PROPELLER IMAGING

(75) Inventors: Ajeetkumar Gaddipati, Waukesha, WI (US); Shaorong Chang, Waukesha, WI (US); Ersin Bayram, Delafield, WI (US); Michael R. Hartley, Novi, MI (US)

(73) Assignee: General Electric Company, Schenectady, NY (US)

( * ) Notice: Subject to any disclaimer, the term of this patent is extended or adjusted under 35 U.S.C. 154(b) by 15 days.

(21) Appl. No.: 11/532,511

(22) Filed: Sep. 15, 2006

(65) Prior Publication Data

US 2008/0068016 A1 Mar. 20, 2008

(51) Int. Cl.
*G01V 3/00* (2006.01)

(52) U.S. Cl. .................................. 324/309; 324/307

(58) Field of Classification Search ............... 324/309, 324/307, 306, 308
See application file for complete search history.

(56) References Cited

U.S. PATENT DOCUMENTS

| 6,680,610 | B1 | 1/2004 | Kyriakos et al. | |
|---|---|---|---|---|
| 6,841,998 | B1 | 1/2005 | Griswold | |
| 7,023,207 | B1 * | 4/2006 | Gaddipati et al. | 324/309 |
| 7,030,609 | B2 | 4/2006 | Pipe | |
| 7,102,348 | B2 * | 9/2006 | Zhang et al. | 324/309 |
| 7,205,763 | B2 * | 4/2007 | Porter | 324/306 |

OTHER PUBLICATIONS

K.P. Pruessmann et al., "SENSE: Sensitivity Encoding for Fast MRI," MRM 42:952-962.
M.A. Griswold et al., "Generalized Autocalibrating Partially Parallel Acquisitions (GRAPPA)," MRM 47:1202-1210.
M.A. Griswold et al., "Field-of-View Limitations in Parallel Imaging," MRM 52:1118-1126.
R.M. Heidemann et al., "VD-Auto-SMASH Imaging," MRM 45:1066-1074, 2001.
E.G. Kholmovski et al., "GARSE: Generalized Autocalibrating Reconstruction for Sensitivity Encoding MRI," ISMRM 2005, 2672.
P. Qu et al., "Optimal Utilization of Acquired k-space Points for GRAPPA Reconstruction," ISMRM 2005,2667.
Z. Wang et al., "Improved Data Reconstruction Method for GRAPPA," MRM 54:738-742, 2005.
S. Skare et al., "Spatial Modeling of the GRAPPA Weights," ISMRM 2005, 2422.
A.C. Brau et al., "Efficient Computation of Autocalibrating Parallel Imaging Reconstructions," ISMRM 2006.
J. Wang et al., "Image Domain Based Fast GRAPPA Reconstruction and Relative SNR Degradation Factor," ISMRM 2005, 2428.
R. Bammer et al., "Improving Image Quality in Fetal MRI Using Autocalibrating Reconstruction for Cartesian (ARC) Sampling," ISMRM 2006.
J. Pipe, "Motion Correction with Propeller MRI: Application to Head Motion and Free-Breathing Cardiac Imaging," Magnetic Resonance in Medicine 42:963-969, 1999.
X. Zhou et al., "Reduction of Ringing and Blurring Artifacts in Fast Spin-Echo Imaging," JMRI Sep./Oct. 1993, vol. 3, No. 5, p. 804-07.

* cited by examiner

*Primary Examiner*—Louis M Arana
(74) *Attorney, Agent, or Firm*—Ziolkowski Patent Solutions Group, SC

(57) ABSTRACT

A system and method of MR imaging enables PROPELLER imaging to be feasibly carried out independently of slice orientation or anatomy of interest. The invention is directed to accelerated acquisition of blades of MR data that are rotated about a central region of k-space and reconstructing an image of arbitrary slice orientation from the blades of MR data that preserves contrast and reduces acceleration artifacts caused by signal amplitude variances.

28 Claims, 9 Drawing Sheets

_US 7,382,127 B2_

SYSTEM AND METHOD OF ACCELERATED MR PROPELLER IMAGING

BACKGROUND OF THE INVENTION

The present invention relates generally to diagnostic imaging and, more particularly, to a system and method of filling partially filled blades of k-space acquired in parallel via a multi-coil array. The present invention is also directed to a process of reducing artifacts introduced in filling the partially filled blades.

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, or "longitudinal magnetization", $M_Z$, may be rotated, or "tipped", into the x-y plane to produce a net transverse magnetic moment $M_t$. A signal is emitted by the excited spins after the excitation signal $B_1$ is terminated and this signal may be received and processed to form an image.

When utilizing these signals to produce images, magnetic field gradients ($G_x$, $G_y$, and $G_z$) are employed. Typically, the region to be imaged is scanned by a sequence of measurement cycles in which these gradients vary according to the particular localization method being used. The resulting set of received NMR signals are digitized and processed to reconstruct the image using one of many well known reconstruction techniques.

Fast Spin Echo (FSE) imaging is an MR imaging technique commonly used as an efficient method of collecting MRI data with minimal artifact. But even FSE images suffer from ghosting artifacts resulting from voluntary or involuntary patient motion as the image acquisition usually takes a few minutes.

A number of imaging techniques have been developed to reduce motion artifacts of FSE images. One such FSE technique, which is referred to as Periodically Rotated Overlapping Parallel Lines with Enhanced Reconstruction (PROPELLER) imaging, encodes an MR signal by collecting data during an echo train such that a rectangular strip, or "blade", through the center of k-space is acquired. This strip is incrementally rotated in k-space about the origin in subsequent echo trains, thereby allowing adequate acquisition of the necessary regions of k-space for a desired resolution image.

Periodically Rotated Overlapping Parallel Lines with Enhanced Reconstruction has been shown to be very effective in reducing artifacts associated with inadvertent subject translational and rotational movements in near axial head scans. PROPELLER is relatively insensitive to motion as the center of k-space is sampled multiple times during acquisition. In addition, explicit correction for rotation and shift are used to further reduce motion artifacts. Notwithstanding the advantages of PROPELLER imaging, its applicability has been limited to acquiring full blades of k-space data due to the complexity of PROPELLER data acquisition and reconstruction techniques.

It would therefore be desirable to have a system and method of MR imaging implementing an accelerated PROPELLER imaging protocol.

BRIEF DESCRIPTION OF THE INVENTION

The present invention overcomes the aforementioned drawbacks with a system and method of reconstructing MR images from MR data acquired using a modified PROPELLER acquisition such that scan time and motion-related artifacts are reduced.

Therefore, in accordance with one aspect of the invention, an MRI apparatus includes an MRI system having a plurality of gradient coils positioned about a bore of a magnet to impress a polarizing magnetic field. An RF transceiver system and an RF switch are controlled by a pulse module to transmit and receive RF signals to and from an RF coil assembly to acquire MR images. The MRI apparatus also includes a computer programmed to, for each of a plurality of receiver coils, (A) acquire k-space data to partially fill a k-space blade of a plurality of k-space data lines extending through a central region of k-space, (B) apply a 1D Fourier Transform to the k-space data lines in a frequency encoding direction, and (C) fill a remainder of the partially filled and transformed blade with data determined from that sampled and transformed in each of the plurality of receiver coils to obtain a filled blade.

In accordance with another aspect of the invention, a method of parallel imaging includes (A) acquiring a k-space data set representing a partially filled blade from each of a plurality of receiver coils, (B) acquiring a set of k-space calibration data lines from each of the plurality of receiver coils, and (C) transforming, in one dimension, the k-space data sets and the sets of k-space calibration data lines to hybrid space. The method also includes (D) determining reconstruction weights from the sets of hybrid space calibration data lines and (E) applying the reconstruction weights to the hybrid space data sets to synthesize a plurality of complete hybrid space blade data sets. A respective image from each of the plurality of complete hybrid space blade data sets is reconstructed.

In accordance with yet another aspect of the invention, the invention is embodied in a computer program stored on a computer readable storage medium and representing a set of instructions that, when executed by a computer, causes the computer to acquire at least one k-space data set of a partially filled blade and fill a remainder of the partially filled blade with data determined from that acquired in the at least one k-space data set. The instructions also cause the computer to apply a T2 decay correction to data in the at least one k-space data set in a phase encoding direction on a per-blade basis such that k-space modulation artifacts are reduced. The instructions further cause the computer to reconstruct an image from the at least one k-space data set comprising T2 decay corrected data.

Various other features and advantages of the present invention will be made apparent from the following detailed description and the drawings.

BRIEF DESCRIPTION OF THE DRAWINGS

The drawings illustrate one preferred embodiment presently contemplated for carrying out the invention.

In the drawings.

DETAILED DESCRIPTION OF THE PREFERRED EMBODIMENT

The present invention is directed to a parallel imaging technique that is applicable to Periodically Rotated Overlapping Parallel Lines with Enhanced Reconstruction (PROPELLER) imaging. K-space is well-known in the art of MR imaging as a matrix that functions as, or is equivalent to, a "frequency domain" repository for positive and negative spatial frequency values that are encoded as complex numbers, e.g., a +bi, i=sqrt(−1). That is, the k-space matrix is generally recognized as the repository for spatial frequency signals acquired during evolution and decay of an MR echo. The k-space matrix in PROPELLER imaging is typically filled with frequency encoded data collected during an echo train such that a rectangular strip, or "blade", through the center of k-space is measured. This strip is incrementally rotated in k-space about the origin in subsequent echo trains, thereby allowing adequate measurement of the necessary regions of k-space for a desired resolution.

After the full k-space is obtained, the elements of the k-space matrix contain positionally-dependent phase change variations along the kx (frequency encode) and ky (phase encode) direction. A 2D inverse Fourier transform decodes the frequency domain information. The 2D Fourier transform is a two step process. First, a row-by-row 1D Fourier transform converts each row of k-space data. After the row-by-row Fourier transform, a column-by-column 1D Fourier transform is performed. Collectively, the pair of 1D Fourier transforms converts the k-space data from the frequency domain (k-space data) to the spatial domain (image space data). An image is then reconstructed from the image matrix illustrating spatial and contrast characteristics of the object imaged.

"Hybrid space" refers to the intermediate matrix that results in the performance of one of the 1D Fourier transforms that comprise the 2D Fourier transform that converts k-space to image space. In other words, in 2D Fourier imaging, one Fourier transform is performed in the frequency encoding direction and another Fourier transform is performed in the phase encoding direction. The matrix after the first 1D Fourier transform is considered a "hybrid space". That is, the data is no longer "untransformed" and therefore not considered k-space; however, the data, as a whole, is not yet in the spatial domain and, thus, not in "image space".

Figure 1:
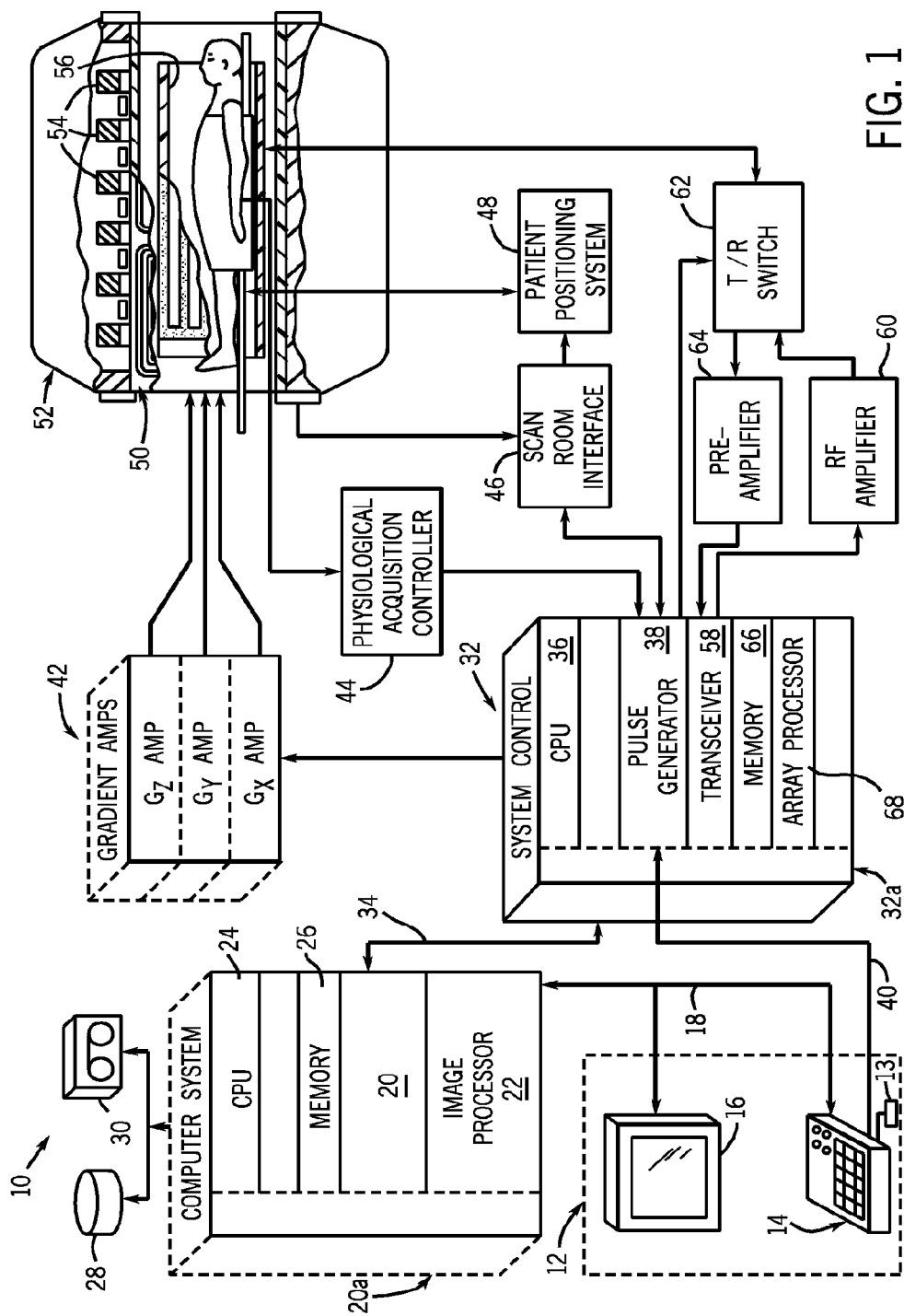
FIG. 1 is a schematic block diagram of an MR imaging system for use with the present invention.

Referring to FIG. 1, the major components of a preferred magnetic resonance imaging (MRI) system 10 incorporating the present invention are shown. The operation of the system is controlled from an operator console 12 which includes a keyboard or other input device 13, a control panel 14, and a display screen 16. The console 12 communicates through a link 18 with a separate computer system 20 that enables an operator to control the production and display of images on the display screen 16. The computer system 20 includes a number of modules which communicate with each other through a backplane 20a. These include an image processor module 22, a CPU module 24 and a memory module 26, known in the art as a frame buffer for storing image data arrays. The computer system 20 is linked to disk storage 28 and tape drive 30 for storage of image data and programs, and communicates with a separate system control 32 through a high speed serial link 34. The input device 13 can include a mouse, joystick, keyboard, track ball, touch activated screen, light wand, voice control, or any similar or equivalent input device, and may be used for interactive geometry prescription.

The system control 32 includes a set of modules connected together by a backplane 32a. These include a CPU module 36 and a pulse generator module 38 which connects to the operator console 12 through a serial link 40. It is through link 40 that the system control 32 receives commands from the operator to indicate the scan sequence that is to be performed. The pulse generator module 38 operates the system components to carry out the desired scan sequence and produces data which indicates the timing, strength and shape of the RF pulses produced, and the timing and length of the data acquisition window. The pulse generator module 38 connects to a set of gradient amplifiers 42, to indicate the timing and shape of the gradient pulses that are produced during the scan. The pulse generator module 38 can also receive patient data from a physiological acquisition controller 44 that receives signals from a number of different sensors connected to the patient, such as ECG signals from electrodes attached to the patient. And finally, the pulse generator module 38 connects to a scan room interface circuit 46 which receives signals from various sensors associated with the condition of the patient and the magnet system. It is also through the scan room interface circuit 46 that a patient positioning system 48 receives commands to move the patient to the desired position for the scan.

The gradient waveforms produced by the pulse generator module 38 are applied to the gradient amplifier system 42 having Gx, Gy, and Gz amplifiers. Each gradient amplifier excites a corresponding physical gradient coil in a gradient coil assembly generally designated 50 to produce the magnetic field gradients used for spatially encoding acquired signals. The gradient coil assembly 50 forms part of a magnet assembly 52 which includes a polarizing magnet 54 and a whole-body RF coil 56. A transceiver module 58 in the system control 32 produces pulses which are amplified by an RF amplifier 60 and coupled to the RF coil 56 by a transmit/receive switch 62. The resulting signals emitted by the excited nuclei in the patient may be sensed by the same RF coil 56 and coupled through the transmit/receive switch 62 to a preamplifier 64. The amplified MR signals are demodulated, filtered, and digitized in the receiver section of the transceiver 58. The transmit/receive switch 62 is controlled by a signal from the pulse generator module 38 to electrically connect the RF amplifier 60 to the coil 56 during the transmit mode and to connect the preamplifier 64 to the coil 56 during the receive mode. The transmit/receive switch 62 can also enable a separate RF coil (for example, a surface coil) to be used in either the transmit or receive mode.

The MR signals picked up by the RF coil 56 are digitized by the transceiver module 58 and transferred to a memory module 66 in the system control 32. A scan is complete when an array of raw k-space data has been acquired in the memory module 66. This raw k-space data is rearranged into separate k-space data arrays for each image to be reconstructed, and each of these is input to an array processor 68 which operates to Fourier transform the data into an array of image data. This image data is conveyed through the serial link 34 to the computer system 20 where it is stored in memory, such as disk storage 28. In response to commands received from the operator console 12, this image data may be archived in long term storage, such as on the tape drive 30, or it may be further processed by the image processor 22 and conveyed to the operator console 12 and presented on the display 16.

The MR system described in FIG. 1 may also be equipped with a receive coil array that picks up the MR signals. Such coil arrays are well-known in the art and include whole body arrays as well as partial body arrays, such as head coil arrays, cardiac coil arrays, and spine coil arrays. As will be described, the invention includes a parallel imaging method wherein a region or volume of interest is sampled with an array of RF receive coils. In this regard, the invention is not limited to a particular coil array type or orientation.

The present invention provides a system and method of MR imaging particularly applicable with protocols such as PROPELLER. In PROPELLER, data is collected during an echo train such that a rectangular strip, or "blade", through the center of k-space is measured. This strip is incrementally rotated in k-space about the origin in subsequent echo trains, thereby allowing adequate measurement of the necessary regions of k-space for a desired resolution. Multiple RF coils receive echoes that are used to create separate blades or strips in k-space. Preferably, each blade extends through the center of k-space. The echo train is sampled such that a blade does not have all lines filled with acquired data. A parallel imaging or partial Fourier technique is used to fill each blade partially acquired. The blades are incrementally rotated about the center of k-space with each echo train, are partially sampled, and are filled until a full set of blade data is acquired.

Figure 2:
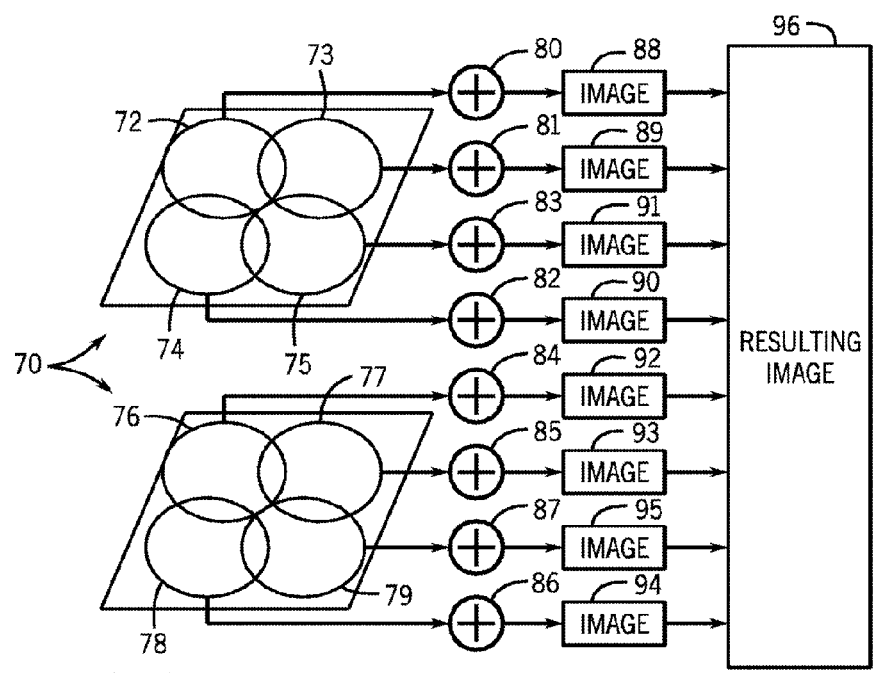
FIG. 2 is a schematic of a coil array usable with the MR imaging system shown in FIG. 1.

Referring now to FIG. 2, a schematic representation of a conventional torso RF coil array 70 is illustrated. The torso RF coil array 70 is a surface coil used to acquire imaging data for a field-of-view (FOV) and includes eight separate coil elements 72-79. Each coil element samples the FOV by detecting changes in excited nuclei in the FOV and transmits signals indicative of that which is detected to separate data acquisition channels 80-87 for each blade in PROPELLER imaging, respectively. According to one embodiment of the present invention, the data from each channel 80-87, once all blades have been acquired, is then used to reconstruct a "coil" image 88-95 whereupon the respective coil images are combined into a composite image 96 using one of a number of known summation techniques, e.g., sum of squares. One skilled in the art will appreciate that the coil array illustrated in FIG. 2 is exemplary and that the invention is not limited to parallel acquisition using such a coil array.

An embodiment of the present invention is directed to an autocalibrating parallel imaging technique to fill un-acquired blade data for accelerated PROPELLER imaging, such as generalized autocalibrating partially parallel acquisitions (GRAPPA), simultaneous acquisition of spatial harmonics (AutoSMASH), variable density AutoSMASH, autocalibrating reconstruction for Cartesian (ARC) sampling, and the like. While an exemplary embodiment of the present invention will be described below using a modified GRAPPA technique, one skilled in the art will readily recognize that the invention is not so limited and that other autocalibrating parallel imaging techniques such as those listed above are also applicable.

Figure 3:
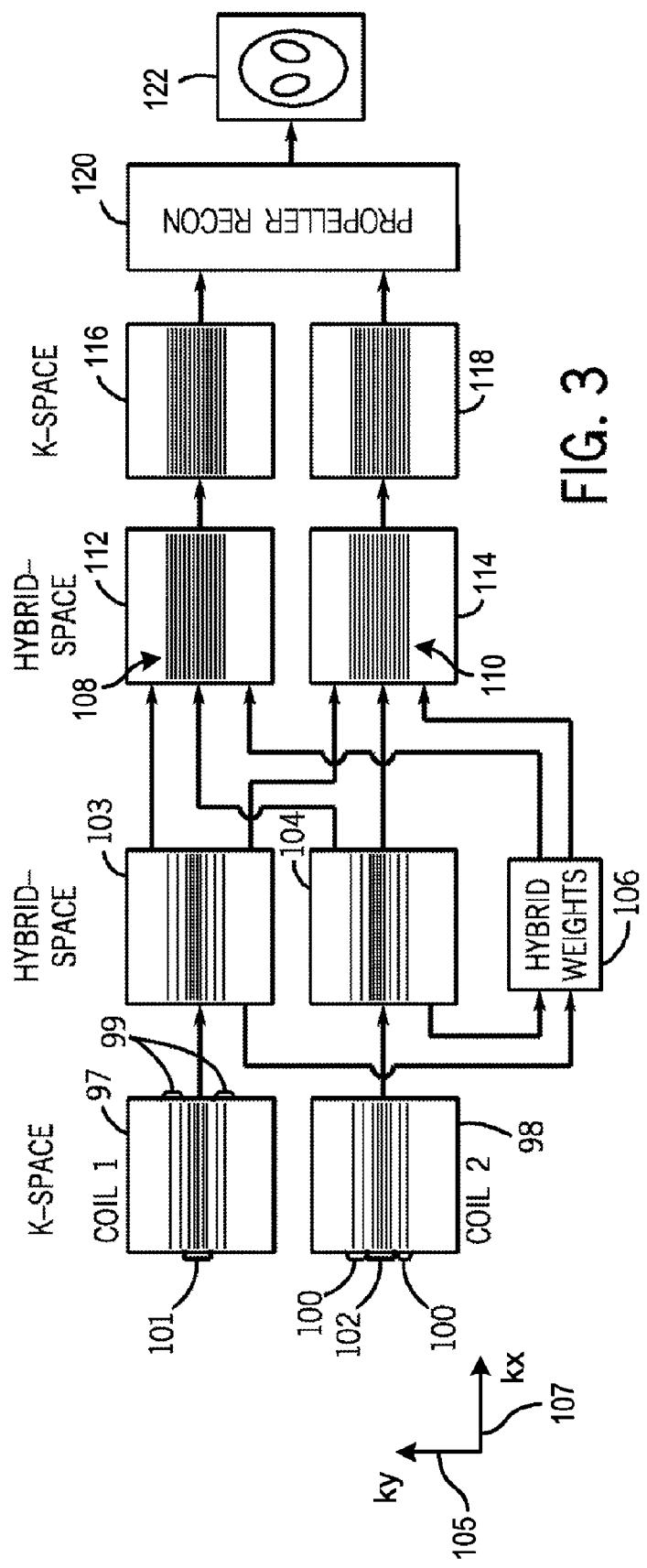
FIG. 3 is a process map illustrating a preferred reconstruction flow in accordance with one aspect of the present invention.

In one embodiment of the invention, the autocalibrating parallel imaging technique is performed in hybrid space. The implementation is shown in FIG. 3 for exemplary purposes as being for a coil array comprising two coils. In the illustrated implementation, two separate k-space data sets 97, 98 are acquired for one blade of a multi-blade scan. Those skilled in art will recognize that rotation of the k-space data sets 97, 98 will vary for each blade acquired. Each k-space data set comprises data sampled from a reduced FOV by a respective coil. Moreover, each k-space data set 97, 98 includes imaging data lines 99, 100 and calibration data lines 101, 102, respectively. As shown, each k-space data set 97, 98 is undersampled in the phase encoding direction 105. That is, a reduced number of phase encoding steps are undertaken so as to reduce scan time. As will be described, the missing phase encoding lines (views) will be synthesized mathematically from the acquired data. Those skilled in art will recognize that the calibration data can also be acquired separately rather than embedded within the scan, so that full acceleration can be accomplished for the parallel imaging scan.

The k-space data sets 97, 98 are Fourier transformed in the one dimension to generate hybrid space data sets 103, 104. Preferably, the 1D Fourier transformations are in the frequency encoding direction 107. The reconstruction weights 106 are then estimated directly from hybrid space data preferably including a floating net-based fitting as described below in FIG. 4.

Then, missing data in the hybrid spaces 103, 104, i.e., the undersampled phase encoding locations, is synthesized efficiently from the acquired imaging and calibration data in hybrid space so as to yield complete blades 108, 110 in hybrid spaces 112, 114. In other words, the phase encoding locations that were not sampled are filled.

Figure 4:
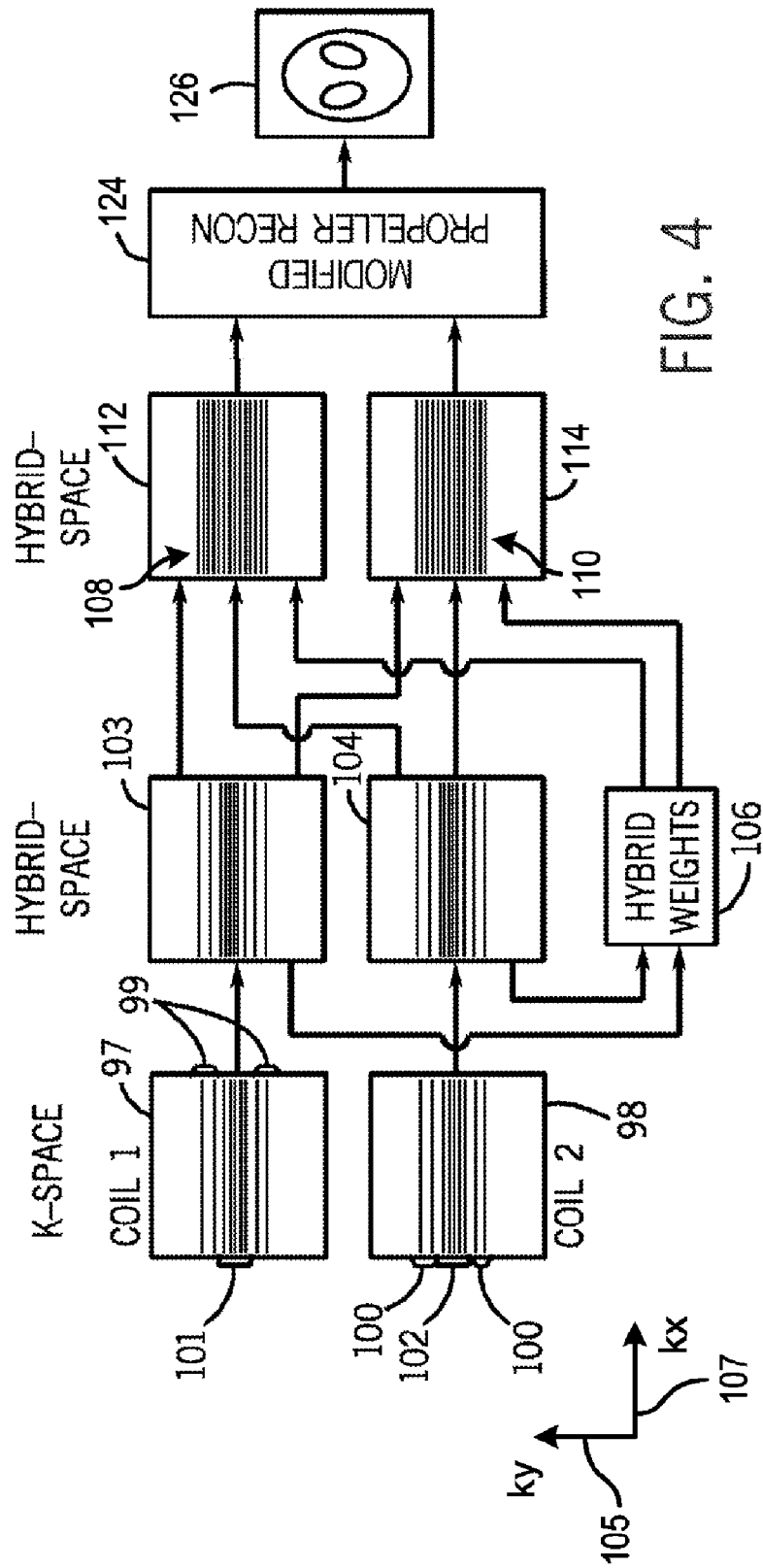
FIG. 4 is a process map illustrating a preferred reconstruction flow in accordance with another aspect of the present invention.

The complete blades 108, 110 are convened to k-space for further PROPELLER processing. In a preferred embodiment, an inverse 1D Fourier Transform is applied to blades 108, 110 in the frequency encoding direction 107 to transform the complete blades 108, 110 to k-space data sets 116, 118. In this manner, k-space data sets 116, 118 provide data to a standard multi-channel PROPELLER reconstruction pipeline 120, the first step of which is applying a 2D Fourier Transform in the phase and frequency encoding directions 105, 107 to convert the k-space data sets 116, 118 to image space, applying phase correction to the images, summing the images into a combined blade image, transferring each blade to k-space for rotation/translation correction, gridding to a full k-space and converting to final images 122. Alternatively, according to another embodiment of the present invention as shown in FIG. 4, the complete blades 108, 110 may be input into a modified multi-channel PROPELLER reconstruction pipeline 124, which includes applying a 1D Fourier Transform in the phase encoding direction 105 to convert the complete blades 108, 110 to image space, applying phase correction to the images, summing the images into a combined blade image, transferring each blade to k-space for rotation/translation correction, gridding to a full k-space and converting to final images 126.

Figure 5:
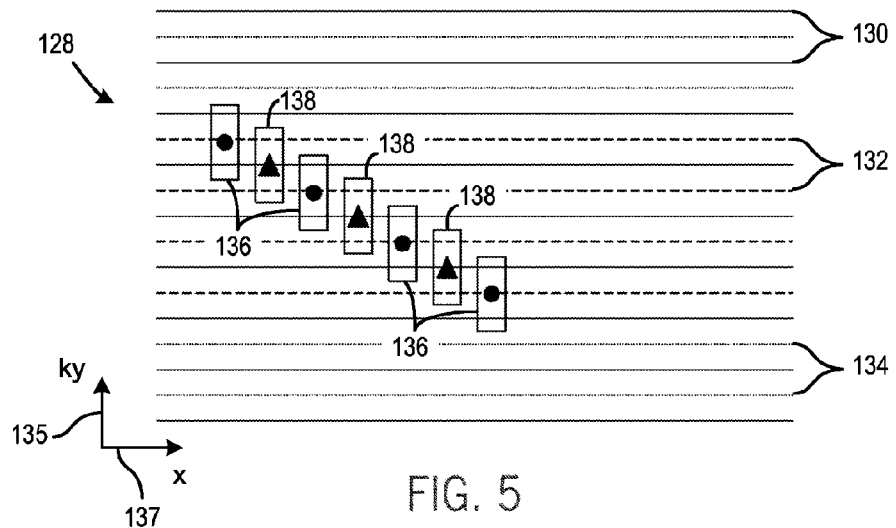
FIG. 5 is an illustration showing a technique for fitting data for reconstruction weight calculation usable with an embodiment of the present invention.
Figure 6:
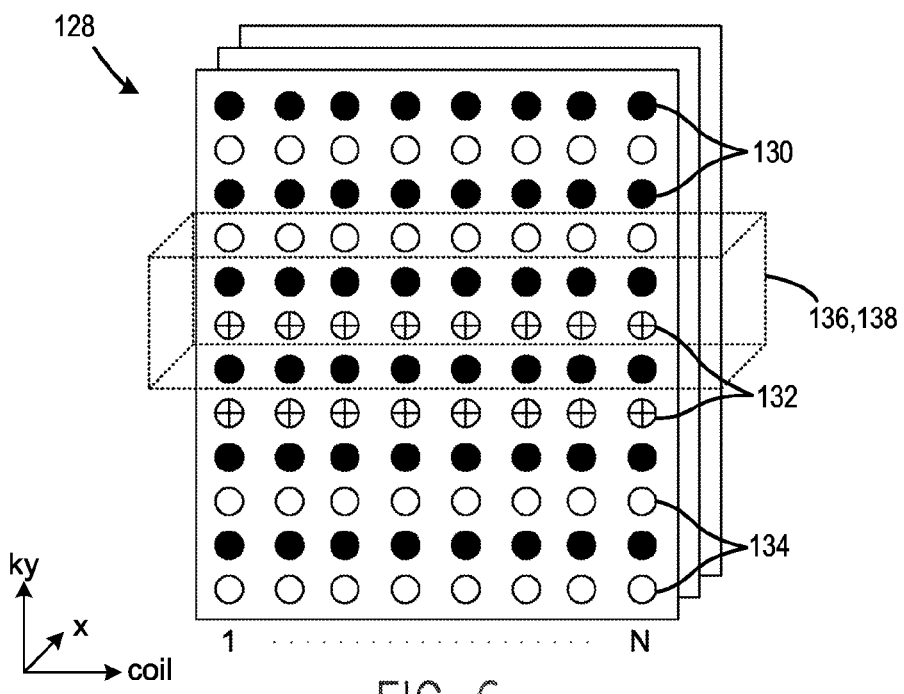
FIG. 6 is an illustration showing a technique for fitting data for reconstruction weight calculation incorporating the technique shown in FIG. 5.

FIG. 5 illustrates fitting data in hybrid space applicable to estimation of reconstruction weights 106 according to one embodiment of the present invention. A plurality of data lines 128 are shown including acquired lines 130, autocalibrated signal (ACS) 132 lines, and lines 134 missing acquired data. In conventional fitting, a number of fitting blocks 136 are fixed resulting in a fixed number of training data sets. In floating net-based fitting, interpolation can be shifted to yield a number of fitting blocks 138 in addition to the conventional fitting blocks 136. As shown in FIG. 6, a fitting block 136, 138 interpolates data in both the frequency encoding direction and the phase encoding direction 135, 137 for coils 1-N. The fitting block 136, 138 of FIG. 5 slides in the phase encoding direction according to the floating net-based fitting described above in FIG. 5 as more training sets are determined.

Table 1 illustrates view ordering of a 36-view blade including a full blade view order (VO) and accelerated blade view orders skipping every other view (phase encode location) of a blade in k-space. Views 18 and 20 are ACS lines, and the center of k-space is located in center views 17, 18, 19, and 20.

TABLE 1

| Group No. | Full Blade VO | Accelerated VO | Accelerated TE Preserving VO |
|---|---|---|---|
| 1 | 01, 02, 03, 04, | 01, 03, 05, 07, | 01, 35, 03, 33, |
| 2 | 05, 06, 07, 08, | 09, 11, 13, 15, | 05, 31, 07, 29, |
| 3 | 09, 10, 11, 12, | 17, 18, 19, 20, | 09, 27, 11, 25, |
| 4 | 13, 14, 15, 16, | 21, 23, 25, 27, | 13, 23, 15, 21, |
| 5 | 17, 18, 19, 20, | 29, 31, 33, 35 | 17, 18, 19, 20 |
| 6 | 21, 22, 23, 24, | | |
| 7 | 25, 26, 27, 28, | | |
| 8 | 29, 30, 31, 32, | | |
| 9 | 33, 34, 35, 36 | | |
| column 1 | column 2 | column 3 | column 4 |

The full blade view order, shown in column 2 of Table 1, shows an arrangement of the views according to a chronological order beginning with view 01 and ending with view 36. The center views of the full blade view order occur in group number 5 beginning at view number 17. T2 decay causes the signal amplitude in each succeeding view to be less than the signal amplitude of previous views.

An accelerated view order, shown in column 3 of Table 1, shows an arrangement of the accelerated views maintaining a chronological order beginning with view 01 and ending with view 35. The center views of the accelerated view order occur in group number 3, beginning eight views prior to the center views 17-20 of the full blade view order. In this manner, the signal amplitudes of the center views of the accelerated view order will be higher than the signal amplitudes of the center views in the full blade view order. Also, views 03-15 and views 21-35 will also have signal amplitudes higher than the signal amplitudes of their counterpart views in the full blade view order. Only view 01 will have a signal amplitude substantially equal to the signal amplitude of view 01 the full blade view order.

Acquiring signal amplitudes using the accelerated view order that have higher amplitudes than counterpart views in the full blade view order results in change of contrast in the final image. To preserve contrast, the accelerated TE preserving view order shown in column 4 of Table 1 rearranges the order of the views such that odd-numbered views 01-15 of the accelerated view order and that the center views have signal amplitudes substantially equal to the signal amplitudes of their counterparts in the full blade view order. The rest of the views will have signal amplitudes greater than their counterparts in the full blade view order.

Figure 7:
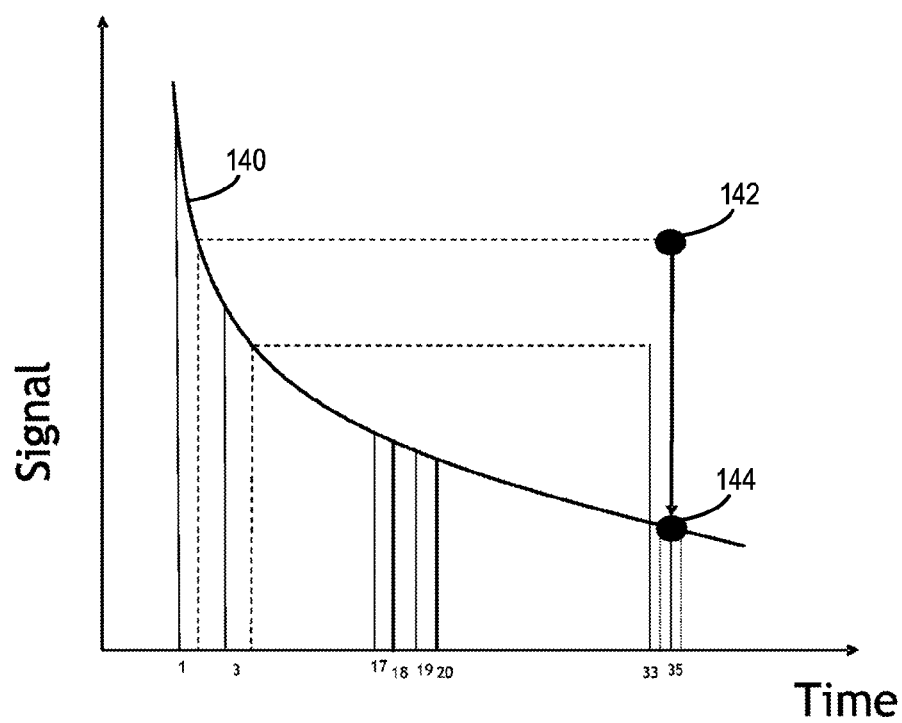
FIG. 7 is a graph showing modified view order signal amplitude correction according to one aspect of the present invention.

FIG. 7 shows correction of signal amplitudes due to T2 decay according to an embodiment of the present invention. A curve 140 shows signal amplitudes for views 01-36 for a full blade view order as described above. As illustrated, the signal amplitudes of echoes acquired in each view become smaller with each succeeding view. Accelerating blade acquisition by acquiring every other view according to the accelerated TE preserving view order of Table 1 causes views 21-35 to be acquired at higher signal amplitudes than in a full blade acquisition. To preserve contrast of the views acquired at signal amplitudes higher than in a full blade acquisition, for example, views 21-35, curve 140 of a single un-accelerated reference blade acquired using zero phase encoding gradients is used to correct the higher signal amplitudes.

As illustrated in FIG. 7, view 35, for example, will have a signal amplitude similar to a signal amplitude of view 2 since view 35 is acquired instead of view 2 in the accelerated sequence. However, the signal amplitude of view 35 in curve 140 is less than the signal amplitude of view 2. The acquired view amplitude 142 is compared to the amplitude 144 of the view in curve 140, and the acquired view amplitude 142 is corrected so as to be substantially similar to amplitude 144. In this manner, differences in contrast between an image reconstructed from accelerated data and an image reconstructed from un-accelerated data are reduced.

For acceleration factors greater than two, the blade width is increased to maintain TE equal to the TE of a fully acquired blade of the same blade width in addition to modifying the view order to preserve TE as described above. With an increased blade width, fewer blades are needed to sample k-space, thus scan time is further reduced.

Figure 8:
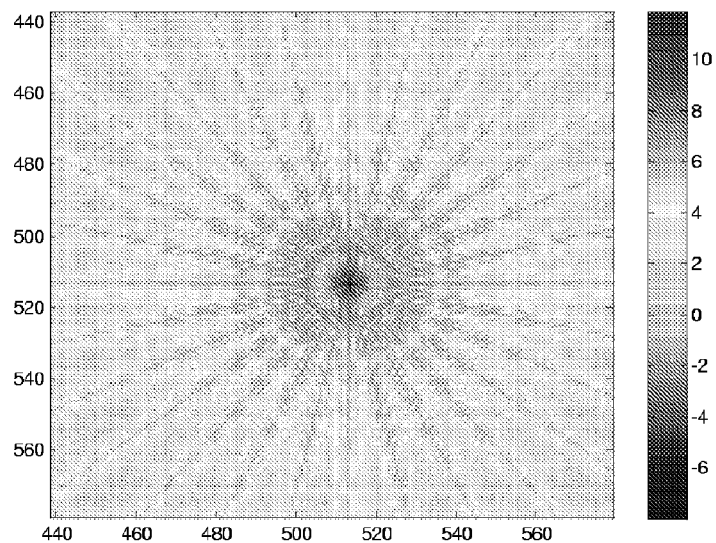
FIG. 8 is an image showing a point spread function for PROPELLER data.
Figure 9:
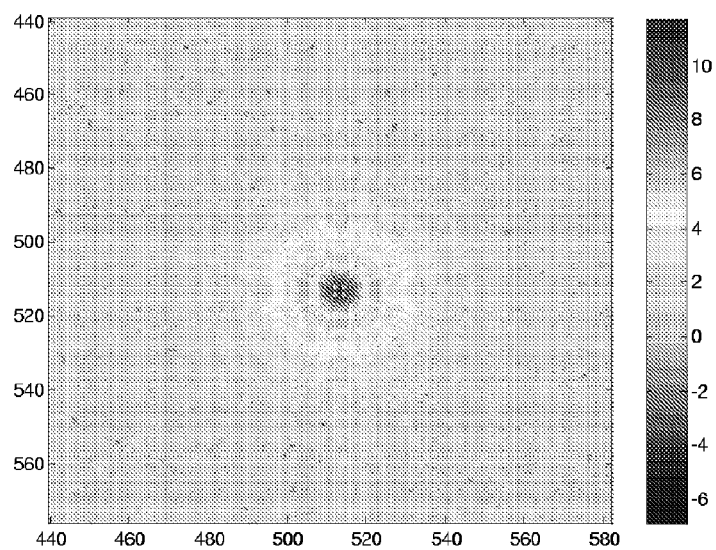
FIG. 9 is an image showing a point spread function for PROPELLER data corrected for T2 decay.

The T2 decay correction described above may additionally include weighing each echo by its inverse exponential decay factor to achieve substantially uniform signal amplitude across all views within a blade assuming no phase encoding. In this manner, a point spread function for PROPELLER reconstruction may yield improved results. FIG. 8 shows a point spread function for combined propeller blades with T2 decay. FIG. 9 shows a point spread function for combined propeller blades with T2 uniform signal amplitude compensation.

Figure 10:
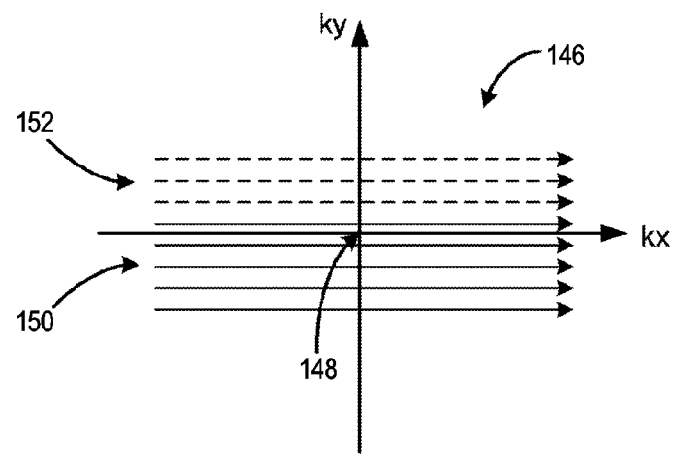
FIG. 10 is a schematic representation of a single blade of k-space that is filled using homodyne processing in accordance with another aspect of the present invention.

According to another embodiment, the present invention includes homodyne processing of a half NEX blade of k-space to accelerate processing using a single coil or a multi-coil array. This is illustrated in FIG. 10. For purposes of illustration, a single blade of k-space will be described, but one skilled in the art will appreciate that the homodyne processing technique described herein is applicable to each acquired blade of k-space.

K-space blade 146 extends through a central region 148 or origin of k-space such during subsequent rotation of the blade 146, the central region 148 will be over-sampled. K-space blade 146 is preferably defined by a number of k-space data lines 150, wherein each line 150 is characterized as either as sampled (solid line) or unsampled (dashed line). Further illustrated in FIGS. 5 and 6 is that not all phase encode locations (views) of the k-space blade 146 is filled with sampled MR data. Since less than all phase encode locations have been sampled, the number of phase encoding steps can be reduced. Alternatively, the number of phase encoding locations (and thus phase encoding steps) can be increased such that after partial filling of each k-space data line, the total number of phase encoding steps equals that of an acquisition not carrying out homodyne processing. As will be described, the un-sampled phase encode locations will be filled with data based on sampled phase encode locations.

While a number of partial Fourier reconstruction techniques may be used to determine data for un-sampled phase encode locations, one preferred technique is homodyne processing. Homodyne processing uses a pair of filters for Hermitian conjugate symmetry to determine data for un-sampled phase encode locations based on the data of sampled phase encode locations. In addition to providing data for un-sampled phase encode locations; homodyne processing also corrects phase errors or variations in the sampled data often attributable to variations in resonance frequency, flow, and motion. With homodyne processing or other partial Fourier reconstruction technique, un-sampled phase encoded locations 152 may be "effectively" sampled without requiring the phase encoding steps that would otherwise be required. Additionally, the time needed to sample an echo (TE) is effectively reduced, which also reduces scan time and increases subject throughput.

It is preferred for the sampled phase encode locations to include slightly more than one-half of a column of k-space. In this regard, spatial-frequency data is acquired for phase encode locations about the center of the k-space data line. Thus, it is contemplated that the number of phase encoding steps can be reduced by slightly less than one-half. On the other hand, the number of phase encoding gradients applied are not reduced, but redefined such that almost all sampled phase encode locations are positioned in slightly more than one-half of the k-space data line. As a result, scan time is not reduced, but spatial resolution is improved for each blade. In effect, the number of phase encode locations can be doubled without requiring a doubling in the number of phase encoding steps.

Figure 11:
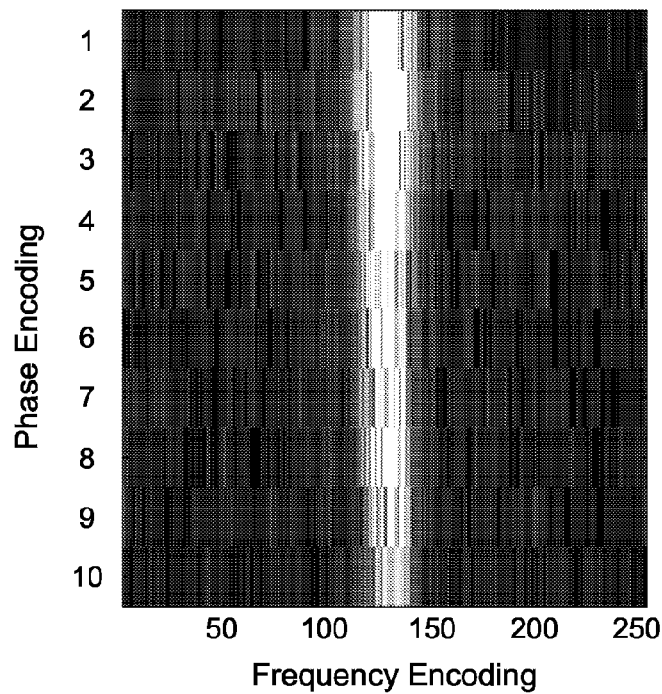
FIG. 11 is an image illustrating a partially filled blade of k-space.
Figure 12:
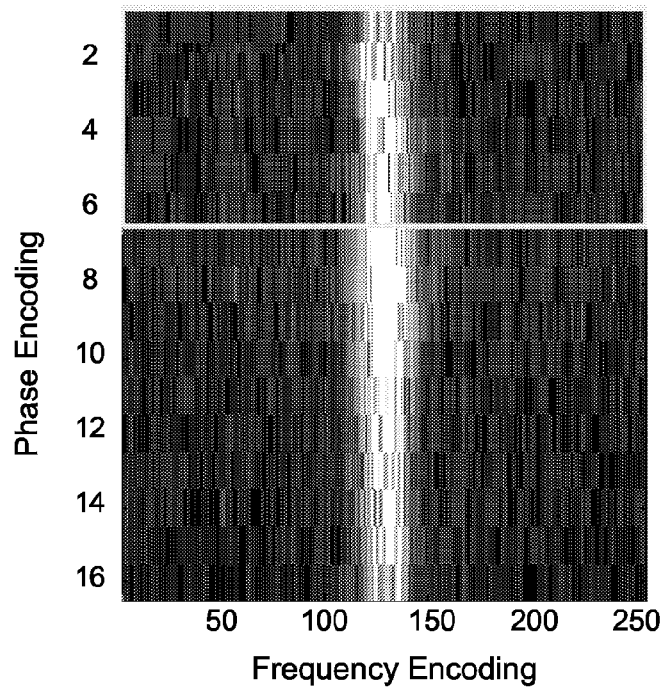
FIG. 12 is an image illustrating a blade of k-space that was originally partially filled and subsequently filled using homodyne processing.

Referring now to FIGS. 11 and 12, two blade images illustrate the blade homodyne processing steps described above with respect to FIG. 10. FIG. 11 is a ten view blade image showing eight views in one-half of k-space and two views in the other half of k-space. After homodyne processing, the ten views are converted to a sixteen view blade showing eight views in one-half of k-space and eight views in the other half of k-space as illustrated in FIG. 12. As a result of the blade homodyne processing, six additional views of data are used during image reconstruction which improves spatial resolution without six additional and time consuming phase encoding steps during data acquisition.

Figure 13:
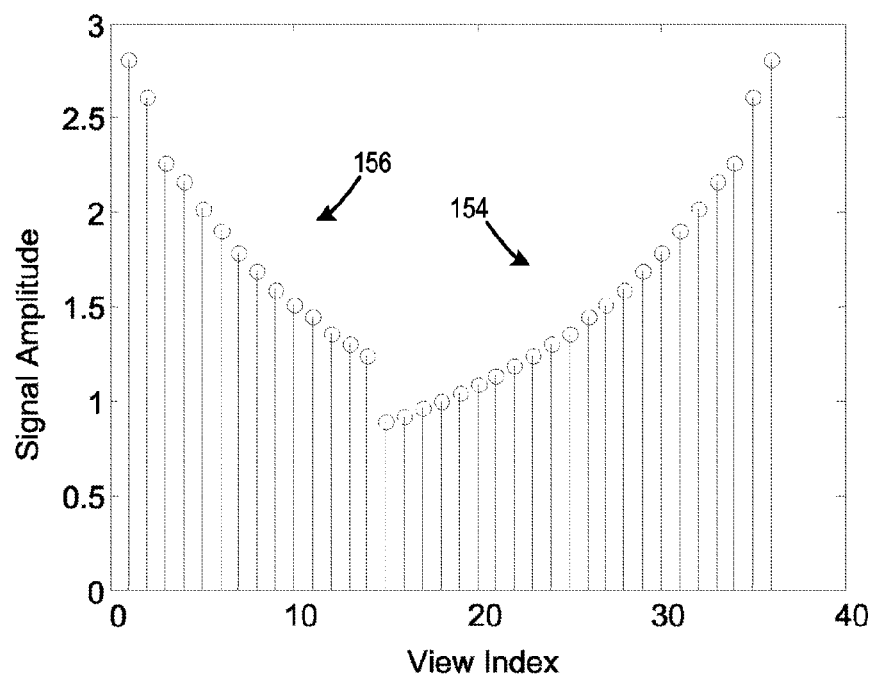
FIG. 13 is a graph showing relative signal amplitude due to T2 decay after homodyne blade processing.

The additional views of data obtained via the blade homodyne process described above results in the signal amplitudes of the additional views after homodyne processing being greater than the signal amplitudes of the corresponding views in a full blade acquisition. FIG. 13 shows a plurality of views 154 (views 15-36) acquired as described above with regard to FIG. 10. Following homodyne processing, the signal amplitudes of views 156 (views 1-14) are substantially similar to the signal amplitudes of views 36-22, respectively. Applying a T2 decay correction as described above with respect to FIG. 7 in a phase encoding direction on a per-blade basis reduces differences in high frequency content between a homodyne-processed image reconstructed from accelerated data and a non-homodyne-processed image reconstructed from un-accelerated data.

Figure 14:
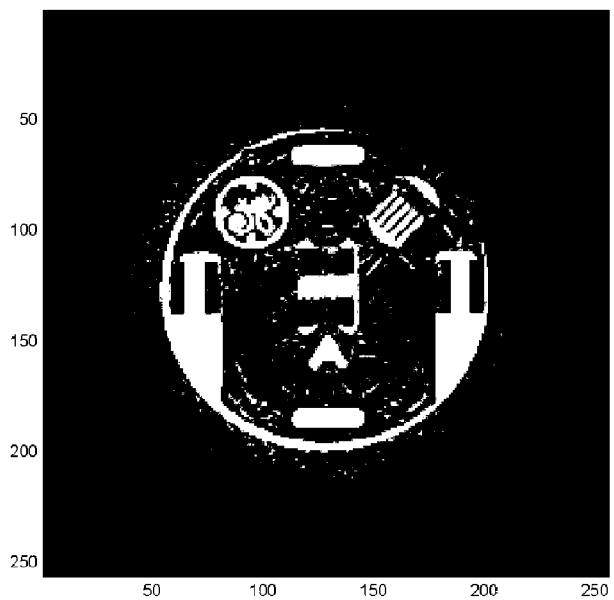
FIG. 14 is an image of a DQA phantom reconstructed from blades of data acquired at different orientations using parallel imaging and a half NEX PROPELLER reconstruction technique.
Figure 15:
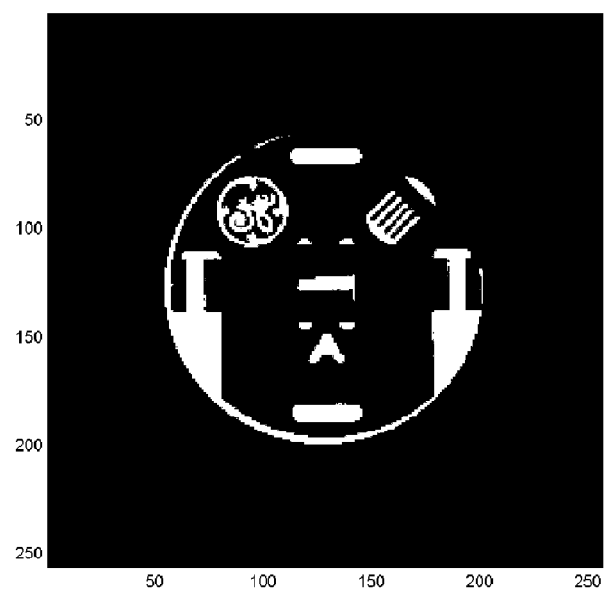
FIG. 15 is an image of a DQA phantom reconstructed from blades of data acquired at different orientations using parallel imaging with a modified half NEX PROPELLER reconstruction technique in accordance with one aspect of the present invention.

FIGS. 14 and 15 further illustrate the advantages achieved with the present invention. Specifically, as shown in FIG. 14, conventional PROPELLER reconstruction of all half NEX blades acquired and homodyne processed from an object results in artifacts introduced into the image. The introduced artifacts are the result, at least in part, of higher signal amplitudes in the additional views obtained through homodyne processing. On the other hand, FIG. 15, which is an image of the same object imaged in FIG. 14, but with the T2 decay correction described herein, shows reduced image artifacts. The image of FIG. 15 is considerably more uniform than the image of FIG. 14, and thus, of greater diagnostic value.

Therefore, in accordance with one embodiment of the invention, an MRI apparatus includes an MRI system having a plurality of gradient coils positioned about a bore of a magnet to impress a polarizing magnetic field. An RF transceiver system and an RF switch are controlled by a pulse module to transmit and receive RF signals to and from an RF coil assembly to acquire MR images. The MRI apparatus also includes a computer programmed to, for each of a plurality of receiver coils, (A) acquire k-space data to partially fill a k-space blade of a plurality of k-space data lines extending through a central region of k-space, (B) apply a 1D Fourier Transform to the k-space data lines in a frequency encoding direction, and (C) fill a remainder of the partially filled and transformed blade with data determined from that sampled and transformed in each of the plurality of receiver coils to obtain a filled blade.

In accordance with another embodiment of the invention, a method of parallel imaging includes (A) acquiring a k-space data set representing a partially filled blade from each of a plurality of receiver coils, (B) acquiring a set of k-space calibration data lines from each of the plurality of receiver coils, and (C) transforming, in one dimension, the k-space data sets and the sets of k-space calibration data lines to hybrid space. The method also includes (D) determining reconstruction weights from the sets of hybrid space calibration data lines and (E) applying the reconstruction weights to the hybrid space data sets to synthesize a plurality of complete hybrid space blade data sets. A respective image from each of the plurality of complete hybrid space blade data sets is reconstructed.

In accordance with yet another embodiment of the invention, the invention is embodied in a computer program stored on a computer readable storage medium and representing a set of instructions that, when executed by a computer, causes the computer to acquire at least one k-space data set of a partially filled blade and fill a remainder of the partially filled blade with data determined from that acquired in the at least one k-space data set. The instructions also cause the computer to apply a T2 decay correction to data in the at least one k-space data set in a phase encoding direction on a per-blade basis such that k-space modulation artifacts are reduced. The instructions further cause the computer to reconstruct an image from the at least one k-space data set comprising T2 decay corrected data.

The present invention has been described in terms of the preferred embodiment, and it is recognized that equivalents, alternatives, and modifications, aside from those expressly stated, are possible and within the scope of the appending claims.

What is claimed is:

1. An MRI apparatus comprising:
   a magnetic resonance imaging (MRI) system having a plurality of gradient coils positioned about a bore of a magnet to impress a polarizing magnetic field and an RF transceiver system and an RF switch controlled by a pulse module to transmit RF signals to an RF coil assembly to acquire MR images; and
   a computer programmed to:
      for each of a plurality of receiver coils:
         (A) acquire k-space data to partially fill a k-space blade of a plurality of k-space data lines extending through a central region of k-space;
         (B) apply a 1D Fourier Transform to the k-space data lines in a frequency encoding direction to transform the partially filled k-space blade into a partially filled hybrid space blade; and
         (C) fill a remainder of the partially filled hybrid space blade with data determined from that acquired and transformed in each of the plurality of receiver coils to obtain a filled hybrid space blade.

2. The apparatus of claim 1 wherein the computer is further programmed to repeat (A)-(C) until a respective image has been reconstructed for a plurality of filled hybrid space blades, each filled hybrid space blade extending through a central region of hybrid space and adjacent filled hybrid space blades being rotated from one another about the central region of hybrid space.

3. The apparatus of claim 2 wherein the computer is further programmed to combine the respective images into a composite image.

4. The apparatus of claim 2 wherein the computer is further programmed to apply an inverse 1D Fourier Transform to the filled hybrid space blade of each of the plurality of receiver coils in the frequency encoding direction before reconstruction of the respective image.

5. The apparatus of claim 1 wherein the computer is further programmed to apply a 1D Fourier Transform to the filled hybrid space blade of each of the plurality of receiver coils in a phase encoding dimension during reconstruction of the respective image.

6. The apparatus of claim 1 wherein the computer is further programmed to determine a set of calibration data lines and a set of acquired data lines of the partially filled and transformed blade for each of the plurality of receiver coils.

7. The apparatus of claim 6 wherein the computer is further programmed to fit data in the set of acquired data lines in each of the plurality of receiver coils to data in the set of calibration data lines in one of the plurality of receiver coils in a phase direction.

8. The apparatus of claim 7 wherein the computer is further programmed to fit data in the set of acquired data lines in each of the plurality of receiver coils to the data in the set of calibration data lines in one of the plurality of receiver coils in a frequency direction.

9. The apparatus of claim 7 wherein the computer is further programmed to fit the data in the set of acquired data lines in each of the plurality of receiver coils based on a floating net-based fitting.

10. The apparatus of claim 1 wherein the computer is further programmed to:
    determine a blade width comprising the number of k-space lines in the blade;
    determine an acceleration factor (R); and
    acquire a set of acquired data lines having one k-space data line for every R k-space lines in the blade width; and
    acquire a set of calibration data lines.

11. The apparatus of claim 10 wherein the computer is further programmed to determine a set of center data lines comprising the set of calibration data lines and a subset of the set of acquired data lines.

12. The apparatus of claim 11 wherein the computer is further programmed to:
    modify a view order for the set of acquired data lines such that data from at least one view for every R views is acquired having a signal amplitude substantially equal to a corresponding signal amplitude acquired in a single, unaccelerated reference blade acquired using zero phase encoding gradients.

13. The apparatus of claim 12 wherein the computer is further programmed to:
    compare the signal amplitude of the at least one view for every R views with its corresponding signal amplitude in the reference blade; and
    adjust the signal amplitude of the at least one view for every R views based on the comparison.

14. The apparatus of claim 12 wherein the computer is further programmed to:
    determine an inverse exponential decay factor each data line in the set of acquired data lines and in the set of calibration data lines; and
    weigh each data line in the set of acquired data lines and in the set of calibration data lines by its determined inverse exponential decay factor.

15. The apparatus of claim 1 wherein the computer is further programmed to apply a parallel imaging technique on the partially filled and transformed blade.

16. The apparatus of claim 15 wherein the parallel imaging technique is one of a GRAPPA technique, an ARC technique, an AUTO-SMASH technique, and a VD-AUTO-SMASH technique.

17. A method of parallel imaging comprising the steps of:
    (A) acquiring a k-space data set representing a partially filled blade from each of a plurality of receiver coils;
    (B) acquiring a set of k-space calibration data lines from each of the plurality of receiver coils;
    (C) transforming, in one dimension, the k-space data sets and the sets of k-space calibration data lines to hybrid space;
    (D) determining reconstruction weights from the sets of hybrid space calibration data lines;
    (E) applying the reconstruction weights to the hybrid space data sets to synthesize a plurality of complete hybrid space blade data sets; and
    (F) reconstructing a respective image from each of the plurality of complete hybrid space blade data sets.

18. The method of claim 17 wherein the step of reconstructing the respective images includes applying a 1D Fourier Transform to each filled hybrid space, with the 1D Fourier Transform applied in a dimension orthogonal to that along which the k-space data sets and the sets of k-space calibration data lines were transformed.

19. The method of claim 17 wherein the step of reconstructing the respective images includes applying an inverse 1D Fourier Transform to each filled hybrid space, with the inverse 1D Fourier Transform applied in the one dimension.

20. The method of claim 17 further comprising the step of combining the respective images into a composite image.

21. The method of claim 17 wherein the step of determining includes fitting data in the hybrid space data sets to data in the hybrid space calibration data lines based on a floating net-based fitting.

22. The method of claim 17 wherein the step of determining includes interpolating the reconstruction weights in the phase direction and in the frequency direction.

23. The method of claim 17 further comprising the step of modifying an acquisition order of k-space data lines such that a signal amplitude of a plurality of data lines in the k-space data set substantially match the signal amplitude of the plurality of data lines acquired in a non-accelerated full k-space blade acquisition.

24. The method of claim 23 further comprising the step of modifying a signal amplitude of each data line in the k-space data set not in the plurality of data lines by a difference between its amplitude in the k-space data set and an amplitude of a corresponding data line in the non-accelerated full k-space blade acquisition.

25. A computer readable storage medium having a computer program stored thereon and representing a set of instructions that, when executed by a computer, causes the computer to:
  acquire at least one k-space data set of a partially filled blade;
  fill a remainder of the partially filled blade with data determined from that acquired in the at least one k-space data set;
  apply a T2 decay correction to data in the at least one k-space data set in a phase encoding direction on a per-blade basis such that k-space modulation artifacts are reduced;
  reconstruct an image from the at least one k-space data set comprising T2 decay corrected data.

26. The computer readable storage medium of claim 25 wherein the set of instructions further causes the computer to:
  acquire a reference k-space data set of a fully filled blade; and
  perform a 1D Fourier Transform along a frequency encode direction on the reference k-space data set to create a reference hybrid space data set of the fully filled blade.

27. The computer readable storage medium of claim 26 wherein application of the T2 decay correction includes having the computer compare a signal amplitude of a data line in the portion of the filled blade to a signal amplitude of a corresponding data line in the reference hybrid space data set and adjust the signal amplitude of the data line in the portion of the filled blade based on the comparison.

28. The apparatus of claim 25 wherein the set of instructions further causes the computer to:
  determine an inverse exponential decay factor for each data line in the portion of the filled blade; and
  weigh each data line in the portion of the filled blade by its determined inverse exponential decay factor.

* * * * *